(12) United States Patent
Lal

(10) Patent No.: US 7,283,068 B2
(45) Date of Patent: Oct. 16, 2007

(54) BINARY DECODERS IN ELECTRONIC INTEGRATED CIRCUITS

(75) Inventor: Abhishek Lal, Haryana (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 0 days.

(21) Appl. No.: 10/615,601

(22) Filed: Jul. 7, 2003

(65) Prior Publication Data

US 2004/0085230 A1 May 6, 2004

(30) Foreign Application Priority Data

Jul. 8, 2002 (IN) .............................. 725/Del/02

(51) Int. Cl.
*H03M 7/00* (2006.01)

(52) U.S. Cl. .................. 341/50; 341/160; 704/219

(58) Field of Classification Search .................. 341/50, 341/55, 102, 133, 160; 704/219
See application file for complete search history.

(56) References Cited

U.S. PATENT DOCUMENTS

| 3,564,510 | A | * | 2/1971 | Bagley et al. ............... 345/204 |
| 4,027,152 | A | * | 5/1977 | Brown et al. ............... 398/190 |
| 4,374,384 | A | * | 2/1983 | Moates ................... 340/870.38 |
| 4,443,788 | A | * | 4/1984 | Breslow ........................ 341/9 |
| 4,710,960 | A | * | 12/1987 | Sato ........................... 704/219 |
| 4,958,157 | A | * | 9/1990 | Miki et al. ................... 341/133 |
| 4,999,630 | A | * | 3/1991 | Masson ....................... 341/120 |
| 5,008,669 | A | * | 4/1991 | Ishibashi et al. ............. 341/102 |
| 5,504,755 | A | * | 4/1996 | Nozuyama ................... 714/725 |
| 5,557,275 | A | * | 9/1996 | van Valburg et al. ........ 341/160 |
| 5,629,697 | A | * | 5/1997 | Miyanishi .................... 341/102 |
| 5,831,566 | A | * | 11/1998 | Ginetti ........................ 341/144 |
| 5,844,515 | A | * | 12/1998 | Park ............................ 341/144 |
| 6,539,535 | B2 | * | 3/2003 | Butts et al. .................... 716/17 |
| 6,696,990 | B2 | * | 2/2004 | Pascucci ...................... 341/55 |

FOREIGN PATENT DOCUMENTS

JP 410164010 A * 6/1998

OTHER PUBLICATIONS

Lee (U.S. Appl. No. 10/436,318), High speed encoder for high speed ADC, filed on May 12, 2003.*

* cited by examiner

*Primary Examiner*—Jean Bruner Jeanglaude
(74) *Attorney, Agent, or Firm*—Lisa K. Jorgenson; E. Russell Tarleton; Seed IP Law Group PLLC

(57) ABSTRACT

An improved binary decoder incorporating a selection circuit that activates a selected output corresponding to a input binary value, and a deselecting circuit coupled to each output that deactivates all other outputs when the selected output is activated. The deselecting circuit arrangement has a single input connected to the selected output and a plurality of outputs each of which is connected to one of the remaining outputs and forces them to the inactive state whenever the selected output is activated.

10 Claims, 4 Drawing Sheets ckt-51

BINARY DECODERS IN ELECTRONIC INTEGRATED CIRCUITS

BACKGROUND OF THE INVENTION

1. Field of the Invention

This invention relates to electronic integrated circuits, and in particular to improved binary decoders in integrated circuits.

2. Description of the Related Art

A binary decoder is a circuit that enables a single selected digital output from a defined set of digital outputs, based on an input binary value. The decoder produces an output signal on the single output that matches the input binary value. Binary decoders are essentially combinatorial logic circuits formed by an arrangement of logic gates. A binary decoder having an input value "n" bits is required to have "$2^n$" outputs one of which corresponds with the n-bit value applied at the input. Binary decoders are widely used for performing selection functions where any single device or any single set of devices are required to be selected or enabled from a defined collection of devices or defined collection of device sets. A typical application is in selecting a row of memory cells in a memory device. Another typical application is in selecting a single IO device from a collection of IO devices in an electronic circuit.

A 2-to-4 decoder implementation according to the known art requires 16 transistors covering four different circuits, one for each combination of the input. At the same time each input signal is required to drive four GATE loads. Similarly, a 3-to-8 decoder requires as many as 32 transistors covering 8 different circuits, one for each combination of inputs, with each input having to drive 4 gate loads. This manner of implementation results in a bulky and expensive circuit requiring an undesirably large chip area. The capacitive loading on the input signals reduces the speed of the operation of the device.

BRIEF SUMMARY OF THE INVENTION

The disclosed embodiments of the invention provide binary decoders requiring fewer transistors, decoders with reduced loading on input signals, reduced size, reduced power consumption, and reduced delay.

To achieve the foregoing, one embodiment of the invention provides an improved binary decoder incorporating a selection circuit that activates a selected output corresponding to the input binary value, and a deselecting circuit coupled to each output that deactivates all other outputs when the selected output is activated. The deselecting circuit arrangement has a single input connected to the selected output and a plurality of outputs, each of which is connected to one of the remaining outputs and forces them to the inactive state whenever the selected output is activated.

More particularly, a binary decoder is provided that, in one embodiment, includes a first pair of parallel-coupled transistors and a second pair of parallel-coupled transistors, the first and second pair of parallel-coupled transistors coupled between a voltage source and first and second outputs, respectively; a third transistor coupled between the first output and a reference potential: a fourth transistor coupled between the second output and the reference potential; and the first output coupled to a first input of the second pair of parallel-coupled transistors, the second output coupled to a first input of the second pair of parallel-coupled transistors, the first and second pair of parallel-coupled transistors each having an input terminal, and the third and fourth transistors each having an input terminal.

In accordance with another aspect of the invention, an decoder for integrated circuits is provided that includes a first set of parallel-coupled transistors coupled between a voltage source and a first output and comprising first, second, and third transistors each having respective inputs; a second set of parallel-coupled transistors coupled between the voltage source and a second output and comprising fourth, fifth, and sixth transistors each having respective inputs; a seventh transistor coupled between the first output and a common node and having an input: an eighth transistor coupled between the second output and the common node and having an input: and a ninth transistor coupled between the common node and a voltage reference and having an input.

BRIEF DESCRIPTION OF THE SEVERAL VIEWS OF THE DRAWINGS

The invention will now be described in accordance with the accompanying drawings, wherein.

DETAILED DESCRIPTION OF THE INVENTION

Figure 1:
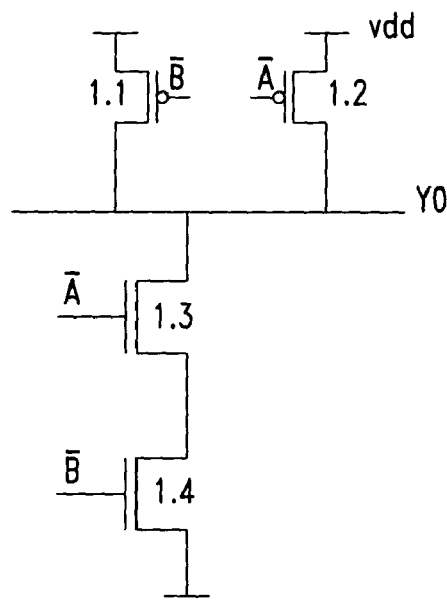
FIG. 1 shows the schematic diagram of a conventional 2-to-4 decoder, which provides an active low output for an input=A'.B'.

FIG. 1 shows one circuit of a conventional 2-to-4 decoder, corresponding to a single combination of the inputs=$\overline{AB}$ or $\overline{A}B$. The output Y0 is set to active low whenever this combination is true, i.e., when A=0 and B=0, transistors 1.3 and 1.4 conduct and pull output Y0 to 0. For any other condition Y0 is set to HIGH.

Figure 2:
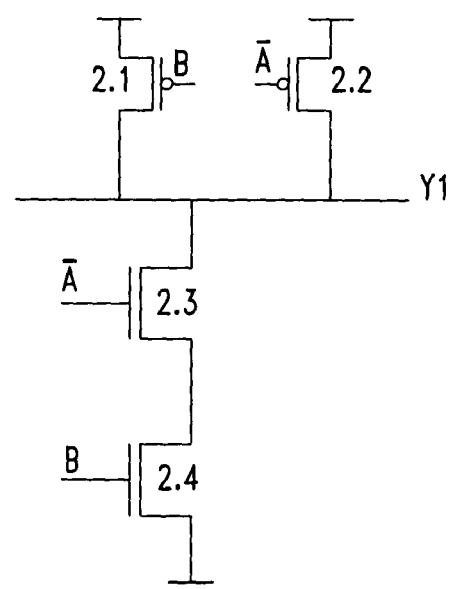
FIG. 2 shows the schematic diagram of a conventional 2-to-4 decoder, which provides an active low output for an input=A'.B.

FIG. 2 shows another circuit of a conventional 2-to-4 decoder, corresponding to another single combination of the inputs=$\overline{A}B$. The output Y1 is set to active low whenever this combination is true, i.e., when A=0 and B=1, transistors 2.3 and 2.4 conduct and pull Y1 to 0. In any other condition Y1 is set to HIGH.

Figure 3:
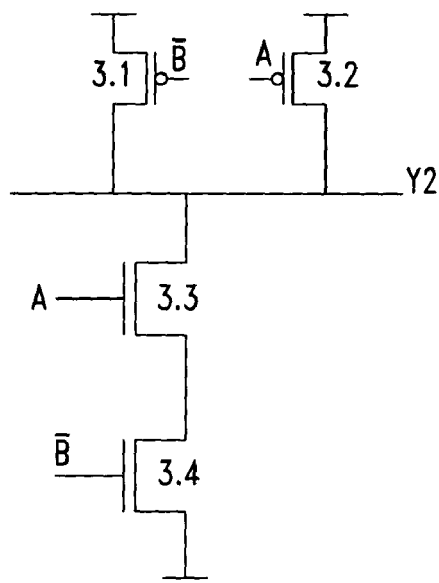
FIG. 3 shows the schematic diagram of a conventional 2-to-4 decoder, which provides an active low output for an input=A.B'.

FIG. 3 shows another circuit of a conventional 2-to-4 decoder, corresponding to the combination of the inputs=A$\overline{B}$, The output Y2 is set to active low whenever this combination is true, i.e., when inputs A=1 and B=0, transistors 3.3 and 3.4 conduct and pull Y2 to 0. In any other condition Y2 is set to HIGH.

Figure 4:
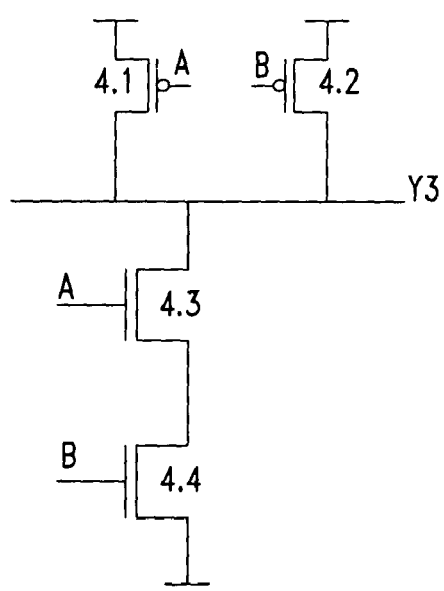
FIG. 4 shows the schematic diagram of a conventional 2-to-4 decoder, which provides an active low output for an input=A.B.

FIG. 4 shows another circuit of a conventional 2-to-4 decoder, corresponding to a combination of inputs=AB, The output Y3 is set to active low whenever this combination is true. As shown, when A=1 and B=1, transistors 4.3 and 4.4 conduct and pull Y3 to '0'. In any other condition Y3 is set to HIGH.

Figure 5:
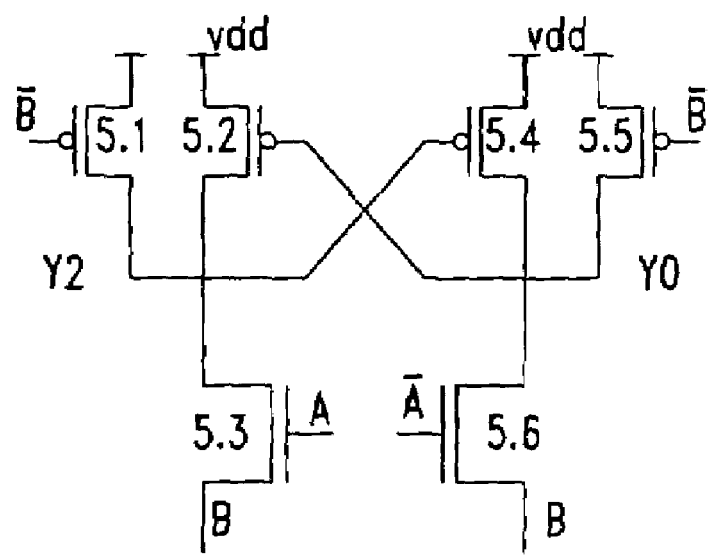
FIG. 5 shows the schematic circuit diagram of a 2-to-4 decoder according to this invention, which provides an active low output for an input=A'.B' and A.B'.
Figure 6:
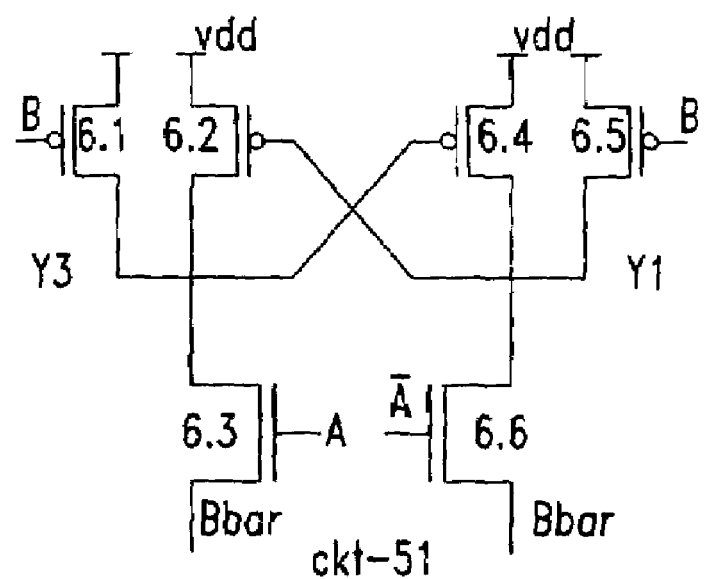
FIG. 6 shows the schematic circuit diagram of a 2-to-4 decoder according to this invention, which provides an active low output for an input=A'.B and A.B.

FIG. 5 shows a schematic circuit diagram for a 2-to-4 decoder in accordance with the invention. The selected output is set active low when the input=$\overline{AB}$ and A$\overline{B}$. When A=0 and B=0, transistor 5.6 conducts and pulls Y0 LOW. This causes transistor 5.2 to conduct, pulling Y2 HIGH. Similarly, when the inputs are A=1, B=0, transistor 5.3 is in conduction pulling Y2 LOW thereby causing transistor 5.4 to conduct and pull Y0 HIGH FIG. 6 shows a schematic diagram of a 2-to-4 decoder in accordance with the invention. For the case when the inputs $\overline{AB}$ and AB. When the inputs are A=0, B=1, transistors 6.6 is in conducting state and pulls Y1 to LOW. This causes transistor 6.2 to conduct pulling Y3 HIGH. Similarly, when the inputs are A=1, B=1, transistor 6.3 is in conducting state and pulls Y3 to LOW. This results in transistor 6.4 conducting and pulling Y1 HIGH.

Figure 7:
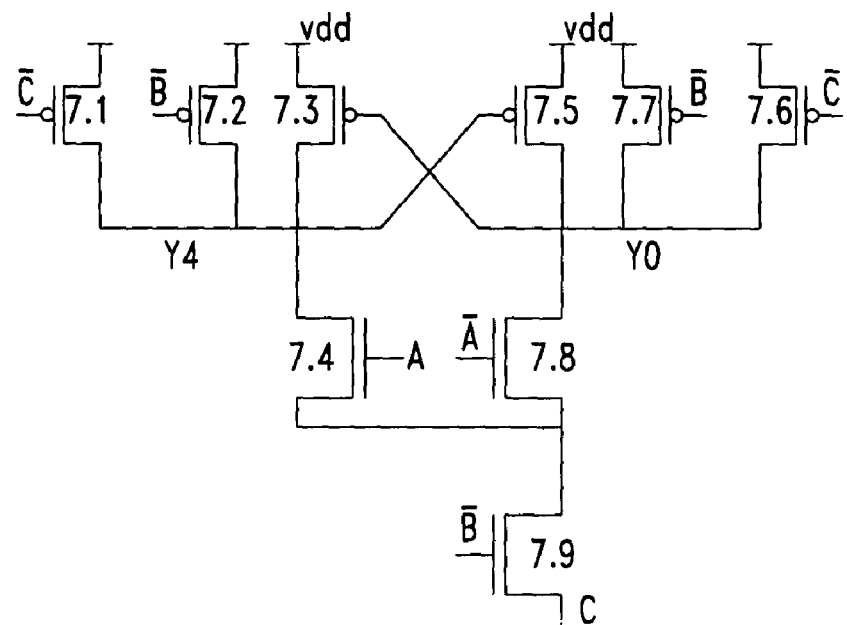
FIG. 7 shows the schematic circuit diagram of a 3-to-8 decoder according to this invention, which provides an active low output for an input=A'.B'.C' and A.B'.C'.

FIG. 7 shows a schematic diagram of a 3-to-8 decoder in accordance with the invention. For the case when the inputs are $\overline{ABC}$ and A$\overline{BC}$. When the inputs are A=0, B=0, C=0 transistors 7.8 and 7.9 are in conduction pulling Y0 LOW. This sets transistor 7.3 conducting pulling Y4 HIGH. Similarly, when the inputs are A=1, B=0, C=0, transistors 7.4 and 7.9 are in conduction and Y4 is pulled LOW. This sets transistor 7.5 conducting, pulling Y0 HIGH.

Figure 8:
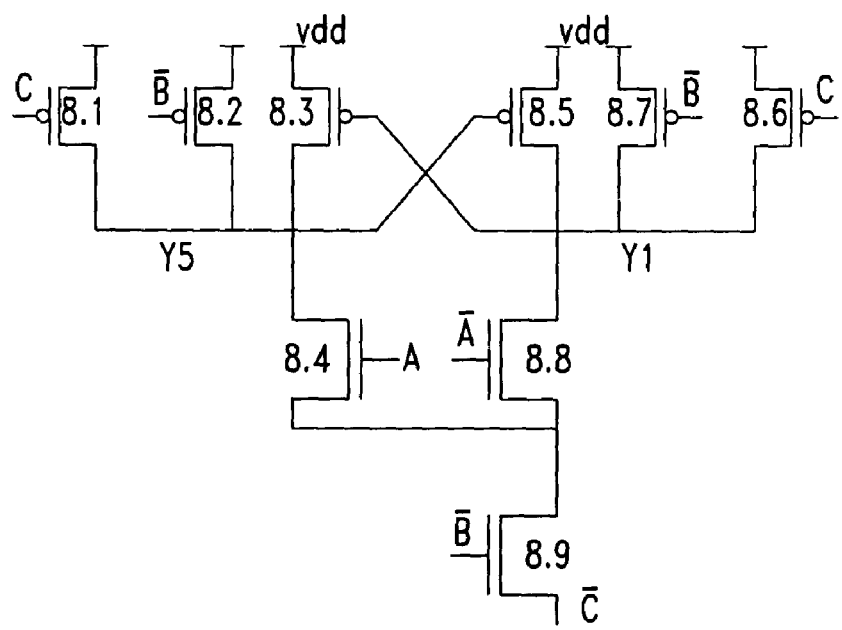
FIG. 8 shows the schematic circuit diagram of a 3-to-8 decoder according to this invention, which provides an active low output for an input=A'.B'.C and A.B'.C.

FIG. 8 shows a schematic diagram of a 3-to-8 decoder in accordance with the invention. For the case when the inputs are $\overline{ABC}$ and A$\overline{B}$C. When the inputs are A=0, B=0, C=1 transistors 8.8 and 8.9 are in conduction and pull Y1 LOW. This sets transistor 8.3 conducting, pulling Y5 HIGH. When the inputs are A=1, B=0, C=1 transistors 8.4 and 8.9 are in a conducting state, pulling Y5 LOW. This sets transistor 8.5 conducting, pulling Y1 HIGH.

Figure 9:
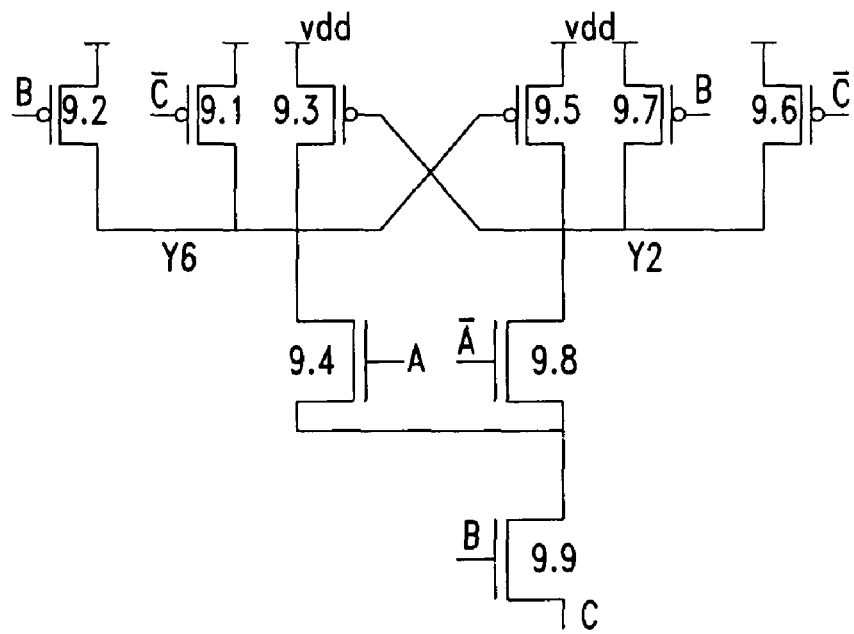
FIG. 9 shows the schematic circuit diagram of a 3-to-8 decoder according to this invention, which provides an active low output for an input=A'.B.C' and A.BC'.

FIG. 9 shows a schematic diagram of a 3-to-8 decoder in accordance with the invention. For the case when the inputs are $\overline{AB}$C and AB$\overline{C}$. When the inputs are A=0, B=1, C=0 transistors 9.8 and 9.9 are in conduction pulling Y2 LOW. This sets transistor 9.3 conducting, pulling Y6 HIGH. Similarly, when the inputs are A=1, B=1, C=0, transistors 9.4 and 9.9 are in a conducting state, pulling Y6 LOW. This sets transistor 9.5 conducting, pulling Y2 HIGH.

Figure 10:
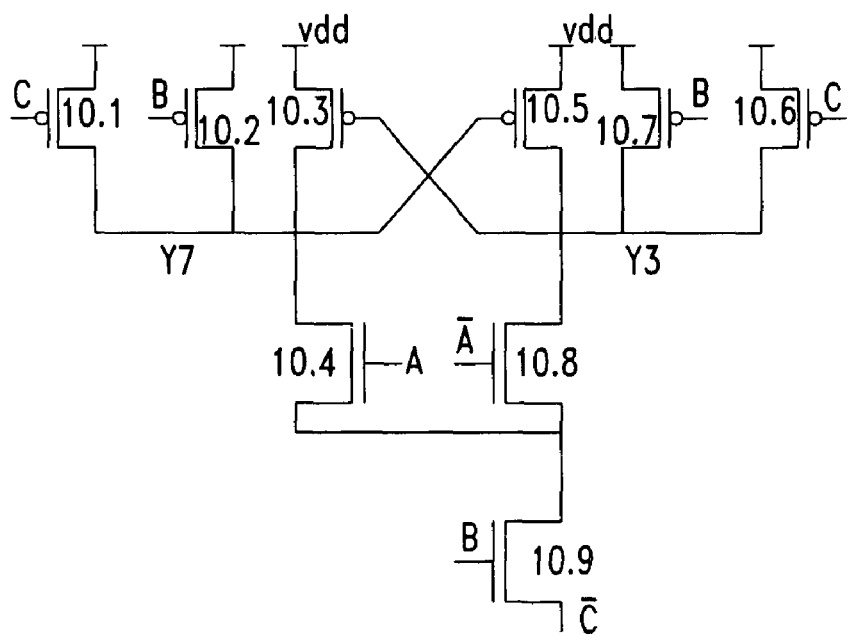
FIG. 10 shows the schematic circuit diagram of a 3-to-8 decoder according to this invention, which provides an active low output for an input=A'.B.C and A.B.C.

FIG. 10 shows a schematic diagram of a 3-to-8 decoder in accordance with the invention. For the case when the inputs are $\overline{A}$BC and ABC. When the inputs are A=0, B=1, C=1, transistors 10.8 and 10.9 are in a conducting state, pulling Y3 LOW. This sets transistor 10.3 conducting pulling Y7 HIGH. Similarly, when the inputs are A=1, B=1, C=1, transistors 10.4 and 10.9 are in conduction, pulling Y7 LOW. This sets transistor 10.5 conducting pulling Y3 HIGH.

Though the invention has been described for "active low" outputs, with only two output pairs in a circuit and for a limited number of input circuits, it will be obvious to a person of ordinary skill in the art that it is possible to implement it for other requirements with minor alterations or extensions. The present invention realizes decoders with a reduced number of transistors compared to conventional implementations, e.g., for realizing a 2-to-4 decoder, the current invention requires 12 transistors as compared to 16 in the conventional scheme. The reduction in the number of transistors increases for larger decoders. For a 3×8 decoder the reduction is 12 transistors, while for a 4×16 decoder the reduction is 32 transistors and so on.

In order to reduce the number of transistors and to reduce the loading on the input signals and hence to increase the speed of operation of the device, the present invention utilizes the selected active output of the decoder to set the other outputs to the inactive state. This also enables the decoder to reduce the loading on the input signals to only two gate loads and two drain loads as against four gate loads in the prior art.

All of the above U.S. patents, U.S. patent application publications, U.S. patent applications, foreign patents, foreign patent applications and non-patent publications referenced in this specification or listed in the Application Data Sheet are incorporated herein by reference in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A binary decoder, comprising:
   a first pair of parallel-coupled transistors and a second pair of parallel-coupled transistors, the first and second pair of parallel-coupled transistors coupled between a voltage source and first and second outputs, respectively;
   a third transistor coupled between the first output and a reference potential, and a fourth transistor coupled between the second output and the reference potential; and
   the first and second pair of parallel-coupled transistors each having an input terminal, and the third and fourth transistors each having an input terminal, the first output coupled to a first input of the second pair of parallel-coupled transistors, the second output coupled to a first input of the second pair of parallel-coupled transistors.

2. The decoder of claim 1, wherein the input terminals of the first and second pair of parallel-coupled transistors are each configured to receive a compliment of a first input signal, the input terminal of the third transistor configured to receive the compliment of a second input signal and the input terminal of the fourth transistor configured to receive the uncomplimented first input signal.

3. The decoder of claim 1, wherein the input terminals of the first and second pair of parallel-coupled transistors are each configured to receive the uncomplimented input of a first input signal, the third transistor having its input terminal configured to receive the compliment of a second input signal, and the fourth transistor having its input terminal configured to receive the uncomplimented second input signal.

4. A decoder for integrated circuits, comprising:
   a first set of parallel-coupled transistors coupled between a voltage source and a first output and comprising first, second, and third transistors, each having respective inputs;

a second set of parallel-coupled transistors coupled between the voltage source and a second output, the second set of parallel-coupled transistors comprising fourth, fifth, and sixth transistors, each having respective inputs;

a seventh transistor coupled between the first output and a common node and having an input, an eighth transistor coupled between the second output and the common node and having an input, and a ninth transistor coupled between the common node and a voltage reference and having an input.

5. The decoder of claim 4, wherein the input of the first transistor is coupled to the second output, the input of the third transistor is coupled to the second output, the input of the seventh transistor is configured to receive an uncomplimented first input signal, the input of the eighth transistor is configured to receive the compliment of the first input signal, the input of the second transistor configured to receive the compliment of a second input signal, the input of the third transistor configured to receive the compliment of a third input signal, the input of the fifth transistor configured to receive the compliment of the second input signal, the input of the sixth transistor configured to receive the compliment of the third input signal, the input of the ninth transistor configured to receive the compliment of the second input signal, and the reference potential set to the uncomplimented third input signal.

6. The decoder of claim 4, wherein the first and second outputs are set to active low.

7. The decoder of claim 4, wherein the input of the first transistor is coupled to the second output, the input of the fourth transistor is coupled to the first output, the input of the seventh transistor is configured to receive an uncomplimented first input signal, the input of the eighth transistor configured to receive the compliment of the first input signal, the input of the second transistor configured to receive the compliment of the second input signal, the input of the third transistor configured to receive an uncomplimented third input signal, the input of the fifth transistor configured to receive the compliment of the second input signal, the input of the sixth transistor configured to receive the uncomplimented third input signal, the input of the ninth transistor configured to receive the complimented input of the second input signal, and the reference potential set to the complimented third input signal.

8. The decoder of claim 4, wherein the input of the first transistor is coupled to the second output, the input of the fourth transistor is coupled to the first output, the input of the seventh transistor is coupled to an uncomplimented first input signal, the input of the ninth transistor is coupled to an uncomplimented second input signal, the input of the second transistor is coupled to a complimented third input signal, the third transistor is coupled to an uncomplimented second input signal, the fifth transistor is coupled to the second uncomplimented input signal, the sixth transistor is coupled to the complimented third input signal, and the ground reference is set to the uncomplimented third input signal.

9. The decoder of claim 4, wherein the input of the first transistor is coupled to the second output, the input of the fourth transistor is coupled to the first input, the input of the seventh transistor is coupled to an uncomplimented first input signal, the input of the second transistor is coupled to an uncomplimented second input signal, the input of the third transistor is coupled to an uncomplimented third input, the input of the fifth transistor is coupled to the uncomplimented second input signal, the input of the sixth transistor is coupled to the uncomplimented third input signal, the input of the eighth transistor is coupled to the complimented first input signal, the input of the ninth transistor is coupled to the uncomplimented second input signal, and the reference voltage set to the complimented third input signal.

10. The decoder of claim 4, wherein the first and second pair of parallel-coupled transistors comprises PMOS transistors, and the third and fourth transistors comprise NMOS transistors.

* * * * *